United States Patent

[11] 3,579,816

[72] Inventors Robert C. Ingraham
Topsfield;
Hubert J. Ramsey, Burlington, Mass.
[21] Appl. No. 786,208
[22] Filed Dec. 23, 1968
[45] Patented May 25, 1971
[73] Assignee Sylvania Electric Products Inc.

[54] METHOD OF PRODUCING SEMICONDUCTOR DEVICES
8 Claims, 10 Drawing Figs.

[52] U.S. Cl. .......... 29/583, 29/589, 29/590, 29/503, 29/472.3
[51] Int. Cl. .......... H01l 7/00, B01j 17/00
[50] Field of Search .......... 29/583, 589, 590, 576 (J), 569, 503, 472.3

[56] References Cited
UNITED STATES PATENTS

| | | | |
|---|---|---|---|
| 2,411,439 | 11/1946 | Lee | 29/503X |
| 3,123,908 | 3/1964 | Boller | 29/503X |
| 3,422,527 | 1/1969 | Gault | 29/583X |
| 3,503,125 | 3/1970 | Haberecht | 29/589X |

*Primary Examiner*—John F. Campbell
*Assistant Examiner*—D. M. Heist
*Attorneys*—Norman J. O'Malley, Elmer J. Nealon and David M. Keay

ABSTRACT: Method of producing stacked semiconductor rectifiers by placing a plurality of wafers of semiconductor material in a jig alternately with thin wire spacers. The jig is immersed in molten solder, the spacers are removed from between the wafers, and the jig is removed from the solder. The wafers are pressed together while the solder cools, and the solidified assembly is sawed through each wafer to form a plurality of stacks of dice.

INVENTORS.
ROBERT C. INGRAHAM
and
HUBERT J. RAMSEY

BY David M. Keay

AGENT.

INVENTORS.
ROBERT C. INGRAHAM
and
HUBERT J. RAMSEY

BY David M. Keay

AGENT.

INVENTORS.
ROBERT C. INGRAHAM
and
HUBERT J. RAMSEY

BY David M. Keay

AGENT.

METHOD OF PRODUCING SEMICONDUCTOR DEVICES

BACKGROUND OF THE INVENTION

This invention relates to semiconductor devices. More particularly, it is concerned with methods of manufacturing high-voltage semiconductor rectifiers.

For certain applications it is desirable to employ semiconductor rectifiers which are capable of sustaining voltages of the order of several thousand volts or more. Since individual semiconductor dice presently available are not capable of withstanding such high voltages, attempts have been made to produce suitable rectifiers by stacking a plurality of dice in a series arrangement. However, the problems of handling small dice, determining their polarity, arranging them in series, and bonding them together are such that it is difficult to fabricate high-voltage stacked rectifiers economically for use in applications requiring low-cost devices, for example in television receivers.

SUMMARY OF THE INVENTION

An improved method of producing high-voltage semiconductor rectifiers by stacking relatively large wafers of semiconductor material and then cutting the stack into individual device units each including a die from each of the wafers is provided by the method of the present invention. In accordance with the method of the invention a plurality of wafers of semiconductor material are assembled in a predetermined spaced-apart relationship and then immersed in molten solder material whereby solder material wets the surfaces of the wafers. The wafers are removed from the solder material and are pressed together while the assembly is permitted to cool and the solder material between the wafers to solidify. The assembly of wafers is then cut through each of the wafers to form a plurality of separate elements each of which includes a portion of each of the wafers. Conductive members are then attached to the portions of the wafers at the ends of the elements. The elements may then be encapsulated in a suitable insulating material for protection so as to provide a completed high-voltage stacked rectifier.

BRIEF DESCRIPTION OF THE DRAWINGS

Various objects, features, and advantages of the method of producing semiconductor stacked rectifiers in accordance with the method of the invention will be apparent from the following detailed discussion and the accompanying drawings wherein.

Figures 1, 2, 3:
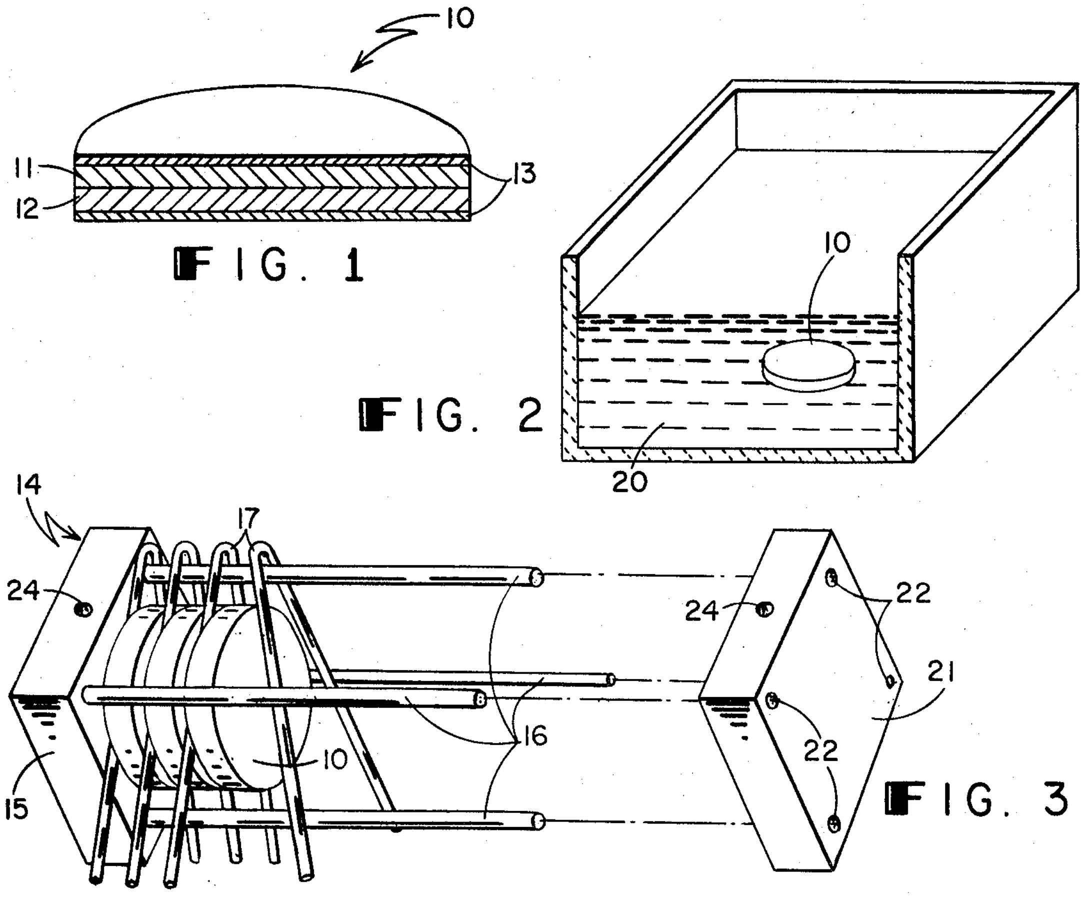
FIG. 1 is a perspective view in cross section of a wafer of semiconductor material to be employed in producing rectifiers in accordance with the method of the invention.
FIG. 2 is a perspective elevational view in cross section illustrating a wafer of semiconductor material immersed in a fluxing material.
FIG. 3 is a perspective view illustrating a plurality of semiconductor wafers being assembled in a jig alternately with spacers for keeping the wafers separated.

Because of the extremely small size of certain portions of the elements illustrated in the drawings, for example the thickness of the wafers of semiconductor material, some of the dimensions of the elements have been exaggerated with respect to other dimensions. It is believed that greater clarity of presentation is thereby obtained despite consequent distortion of elements in relation to their actual physical appearance.

DETAILED DESCRIPTION OF THE INVENTION

The method of producing high-voltage stacked rectifiers in accordance with the present invention employs a plurality of wafers of semiconductor material 10 as illustrated in FIG. 1. Each wafer includes a circular slice of semiconductor material, for example, silicon, having an N-type region 11 and a P-type region 12 which form a PN junction lying parallel to the flat, parallel, opposed major surfaces of the wafer. The regions of opposite conductivity type may be formed by diffusion appropriate conductivity type imparting materials into one or both surfaces of the wafer or by other well-known conductivity type imparting techniques. Gold may be diffused into the slice to increase the switching speed of the devices. Both major surfaces of the wafer are coated with conductive material 13. Specifically, the wafer may be about 1½inches in diameter by approximately 12 mils thick. The conductive coatings 13 are electroless plated nickel of the order of 100 microinches thick.

The wafers are assembled in a jig 14 as shown in FIG. 3. The jig includes a flat plate 15 of a suitable refractory material, for example alumina, and four rods 16, which also may be of alumina, fixed to the plate and extending normal to the plate and parallel to each other. The arrangement of the rods is such so as to accommodate the wafers 10 while confining them laterally. The wafers 10 are placed in the jig 14 alternately with spacers 17 which prevent the major surfaces of adjacent wafers from contacting each other. Each spacer 17 is a generally V-shaped length of 20 mil nickel wire.

As each wafer is individually picked up, it is checked to determine polarity, dipped in a suitable flux 20, for example zinc chloride, as illustrated in FIG. 2, and placed in the jig. 14. The wafers are assembled in the jig 14 with the major surfaces of adjacent wafers in juxtaposition. The N-type region of each wafer is arranged adjacent the P-type region of an adjacent wafer. After the desired number of wafers 10 alternated with spacers 17 are assembled in the jig. 14, an end plate 21 of alumina having openings 22 which permit the rods 16 to pass freely is placed on the rods.

Figure 4:
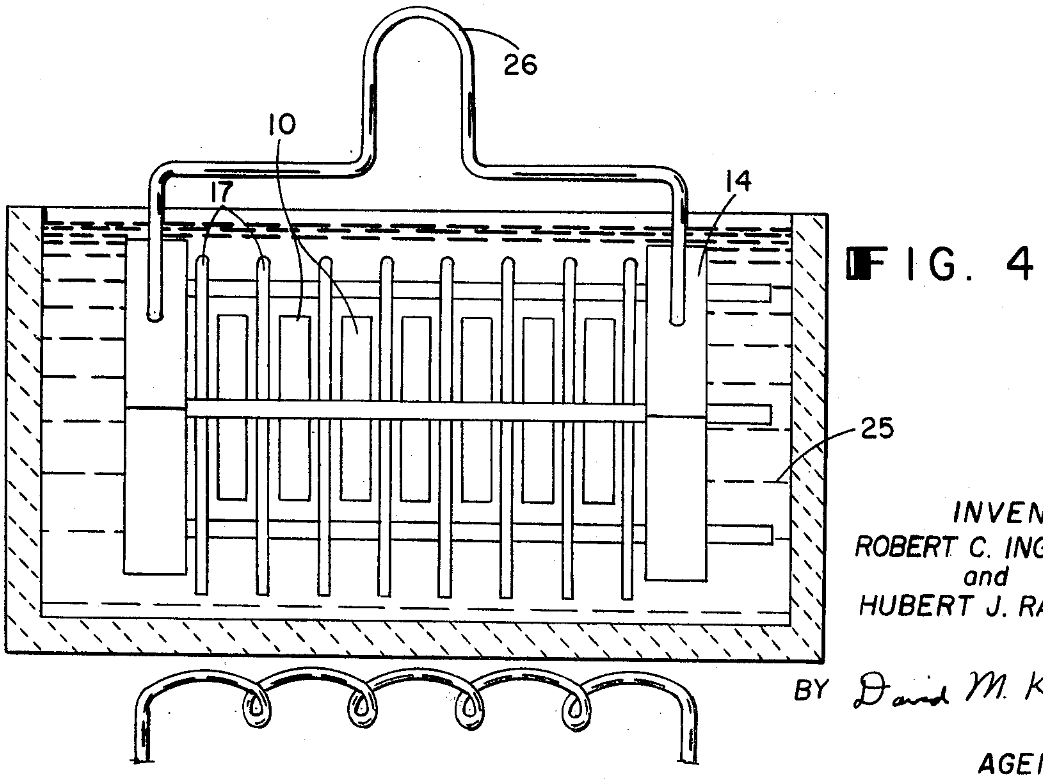
FIG. 4 is an elevational view in cross section illustrating the assembled wafers and spacers in the jig being immersed in molten solder material.

The jig 14 containing the wafers 10 and the spacers 17 is then immersed in a heated bath 25 of molten solder material as illustrated in FIG. 4. During this operation the jig may be held by a handle 26 which fits into holes 24 in the edges of the end plates 21. The solder may be a 95—5 percent lead-silver alloy heated to a temperature of about 340° C. The jig. 14 is placed in the solder bath 25 with the major surfaces of the wafers 10 vertical so as to facilitate solder flow upward between the wafers. The spacers 17 separate the wafers while contacting only relatively small areas of their major surfaces, thus permitting solder to flow across and wet the major surfaces of all the wafers. Since the spacers are nickel, they do not contaminate the solder bath. The jig may be agitated while immersed to further insure contact of solder material with all of the nickel coated surfaces of the wafers.

Figure 5:
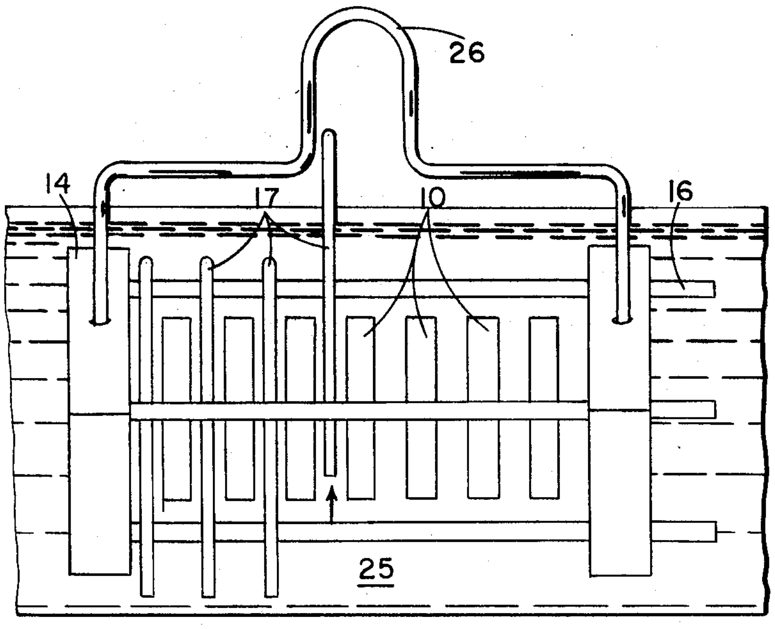
FIG. 5 is a fragmentary elevational view illustrating the spacers being removed from between the semiconductor wafers while the wafers are immersed in the molten solder material.

After the jig 14 has been in the solder bath 25 for a period of from 2 to 3 minutes, the spacers 17 are removed one by one as illustrated in FIG. 5 while the wafers remain immersed in the solder. Since the spacers 17 are supported by only one of the rods 16 of the jig with their apex uppermost, they may be readily removed from the jig without disturbing the wafers confined in the jig.

Figure 6:
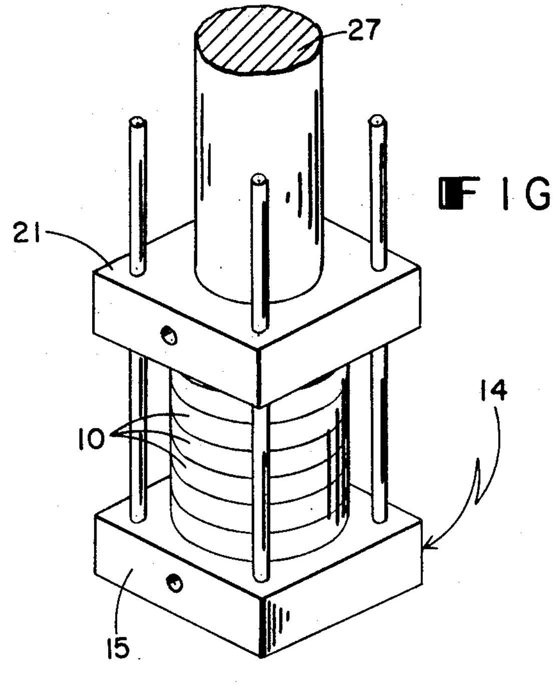
FIG. 6 is a perspective view illustrating the wafers of semiconductor material being cooled under pressure forcing them together after removal from the molten solder material.

The jig 14 is then removed from the solder bath 25, and the wafers 10 are urged toward each other while being permitted to cool. As illustrated in FIG. 6, the jig 14 may be arranged with the first plate 15 downward and the wafers horizontal. A weight 27 exerting a total force of about 10 to 12 pounds is placed on the upper plate 21 pressing the wafers together and forcing out excess solder from between the wafers. This condition is maintained until the solder is solidified at least sufficiently to hold the assembly together. The layers of solidified solder between the wafers are approximately 1 mil thick.

Figures 7, 8:
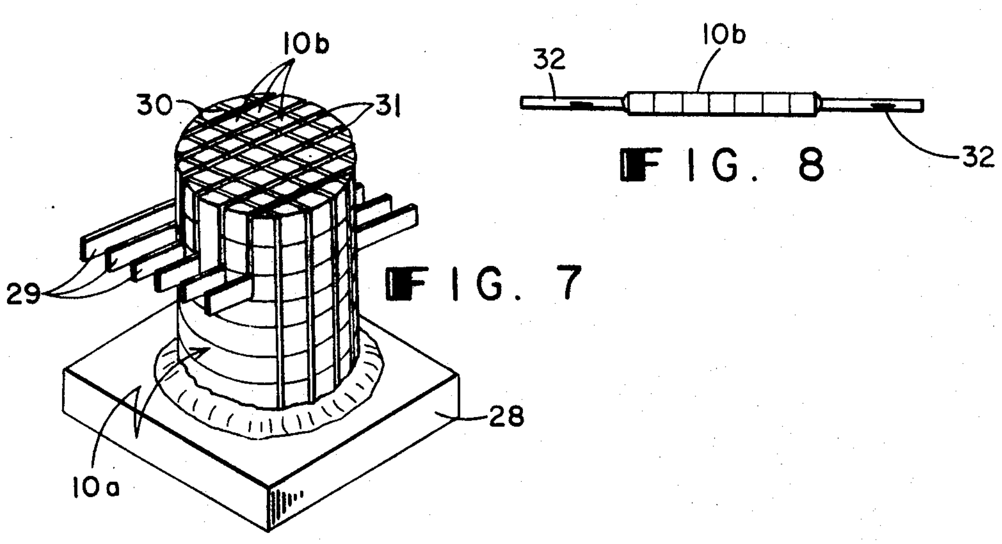
FIG. 7 is a perspective view illustrating the solidified assembly of semiconductor wafers being sawed into individual elements.
FIG. 8 is an elevational view of an individual semiconductor element with conductive leads attached.

The solidified assembly 10*a* is removed from the jig and cemented to a mounting plate 28 as illustrated in FIG. 7. The mounting plate with assembly attached is mounted in a sawing apparatus of the type employing a plurality of parallel blades 29 dressed with particles of diamond. A first set of parallel grooves 30 is cut completely through the assembly normal to the major surface of the wafers. The mounting plate with the assembly is removed from the sawing apparatus and the assembly is dipped in a suitable wax which fills the first set of grooves 30 and strengthens the assembly. The mounting plate with assembly is replaced in the sawing apparatus with the first set of grooves 30 normal to the saw blades 29, and a second set of grooves 31 is cut through the wafers perpendicular to the first set as indicated in FIG. 7. The intersecting sets of grooves produce a plurality of separate semiconductor elements 10*b*, each including a die of semiconductor material from each of the wafers. Each die in the usable semiconductor elements is square, and may, for example, be of the order of 35 mils square.

After the sawing operation, the wax in the first set of saw cuts and the mounting cement are dissolved. Conductive members, specifically nail-head leads 32, are attached to the dice at the ends of the semiconductor elements 10*b* as illustrated in FIG. 8. The leads may be bonded to the dice by soldering with a solder material having a melting temperature below that of the solder material between the wafers.

Figure 9:
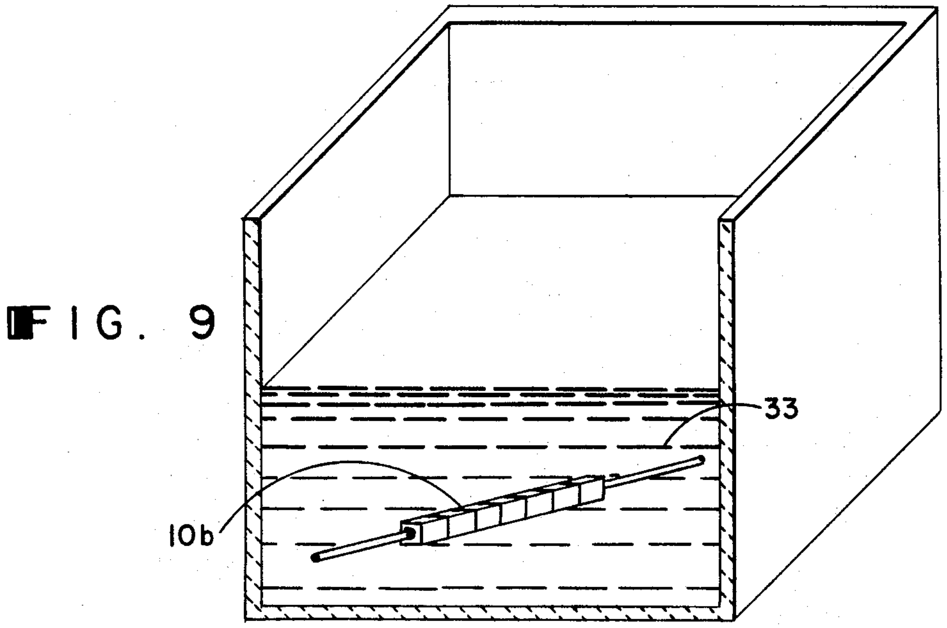
FIG. 9 is a perspective elevational view in cross section illustrating an element of stacked semiconductor dice being treated in an etching or cleaning solution.

The semiconductor elements are then treated to remove mechanically worked semiconductor material at the edges of the dice which has been disturbed during the sawing procedure, and also to remove conductive material at the edges of the dice which might adversely affect the electrical characteristics of the device. The semiconductor elements 10*b* are first immersed in an etching solution 33 of 665 parts by volume of 48 percent by weight hydrogen fluoride solution, 335 parts by volume of concentrated nitric acid, and 200 parts by volume of water for a period of from 10 to 15 seconds as illustrated in FIG. 9. After rinsing, the elements are immersed in a solution of 250 parts by volume of 48 percent by weight hydrogen fluoride solution and 750 parts by volume of concentrated nitric acid for from 10 to 15 seconds. The semiconductor elements are then rinsed and placed in a solution of 700 parts by volume of concentrated nitric acid and 300 parts by volume of concentrated acetic acid. Next, the elements are treated in a chelating agent, for example, an ethylene diamine tetra acetic acid sodium salt chelating agent manufactured by Dow Chemical Co. and designated as Versene 0100. The elements are immersed in the chelating agent for a period of from 20 to 30 seconds to overcome the adverse effects of metallic ions at the PN junctions of the semiconductor dice. The elements are treated again in the solution of 700 parts by volume of concentrated nitric acid and 300 parts by volume of concentrated acetic acid for a period of from 5 to 10 seconds, and then given a final rinse and dried.

After the cleaning, etching, and drying procedures, the semiconductor elements may be encapsulated or otherwise packaged for protection. By way of example, a semiconductor element may first be coated with a suitable coating, such as Dow Corning DC1049 silicone coating, and then covered with a suitable conformal coating compound, such as Dow Corning Q96–005bPC coating.

Figure 10:
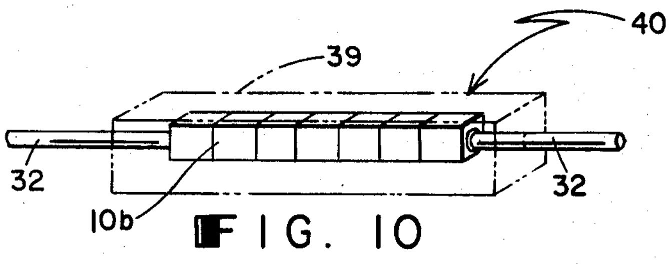
FIG. 10 is a perspective view illustrating a completed semiconductor device with the outline of solidified encapsulating material indicated in phantom.

A completed stacked rectifier device 40 including the semiconductor element 10*b*, the attached conductive leads 32, and the solidified encapsulated material 39 (outline in phantom) is illustrated in FIG. 10. Stacked rectifier devices have been fabricated according to the foregoing method employing stacks of from 10 to 70 wafers of silicon. These devices readily withstand applied voltages of from 6,000 volts for 10 dice to as high as 50,000 volts for 70 dice. Various electrical characteristics, such as forward and reverse conduction, depend on the characteristics of the semiconductor material of the wafers.

The method in accordance with the invention provides thorough, uniform wetting of all portions of the major surfaces of all the wafers in the jig by the molten solder. Thus, although the solidified assembly of wafers is sawed into more than a thousand individual stacked elements, good adherence is obtained between all the dice and the stacks of dice constituting each of the semiconductor elements is mechanically strong. The method permits economical batch processing of a stack of wafers from which hundreds of devices are produced, and avoids the handling and orienting of small individual dice.

While there has been shown and described what is considered a preferred embodiment of the present invention, it will be obvious to those skilled in the art that various changes and modifications may be made therein without departing from the invention.

We claim:

1. The method of producing semiconductor devices including the steps of plating each of the major surfaces of a plurality of wafers of semiconductor material having flat, parallel, opposed major surfaces with a layer of conductive material;

assembling the plurality of wafers of semiconductor material in a predetermined spaced-apart relationship with major surfaces of adjacent wafers in juxtaposition;

immersing the assembled plurality of wafers in molten solder material capable of wetting the conductive material whereby solder material wets the conductive material on the major surfaces of the wafers;

removing the assembled plurality of wafers from the molten solder material;

pressing the wafers toward each other while permitting the assembly to cool and solder material between the wafers to solidify;

cutting the assembly through each of the wafers generally normal to the major surfaces to form a plurality of separate elements each including a portion of each wafer of semiconductor material; and attaching conductive members to the portions of the wafers of semiconductor material at the ends of the elements;

wherein the step of assembling the plurality of wafers of semiconductor material includes placing spacers between each wafer and the wafers adjacent thereto, the area of contact of each spacer with the conductive material on the major surface of a wafer being small relative to the area of the major surface;

and including the step of removing the spacers from the assembled plurality of wafers subsequent to the step of immersing the assembled plurality of wafers and spacers in molten solder material and prior to the step of pressing the wafers toward each other.

2. The method of producing semiconductor devices in accordance with claim 1 wherein each of said wafers has a region of semiconductor material of one conductivity type adjacent one major surface and a region of the opposite conductivity type adjacent the opposite major surface, said regions forming a PN junction therebetween parallel to the major surfaces; and said wafers are assembled with the region of the one conductivity type of each wafer adjacent the region of the opposite conductivity type of a wafer adjacent thereto.

3. The method of producing semiconductor devices in accordance with claim 1 including the step of agitating the assembled plurality of wafers and spacers while the assembled plurality of wafers and spacers is immersed in molten solder material.

4. The method of producing semiconductor devices in accordance with claim 1 wherein the step of cutting the assembly includes sawing intersecting sets of grooves through the assembly normal to the major surfaces of the wafers to form a plurality of separate elements each including a die of semiconductor material from each wafer of semiconductor material;

and including the step of treating the elements in etching material to remove conductive material and semiconductor material disturbed by sawing at the edges of the dice.

5. The method of producing semiconductor devices including the steps of plating each of the major surfaces of a plurality of wafers of semiconductor material having flat, parallel, opposed major surfaces with a layer of nickel;

assembling the plurality of wafers of semiconductor material in a predetermined spaced-apart relationship with major surfaces of adjacent wafers in juxtaposition;

immersing the assembled plurality of wafers in molten solder material capable of wetting nickel whereby solder material wets the nickel plating on the major surfaces of the wafers;

removing the assembled plurality of wafers from the molten solder material;

pressing the wafers toward each other while permitting the assembly to cool and solder material between the wafers to solidify;

cutting the assembly through each of the wafers generally normal to the major surfaces to form a plurality of separate elements each including a portion of each wafer of semiconductor material; and attaching conducting members to the portions of the wafers of semiconductor material at the ends of the elements;

wherein the step of assembling the plurality of wafers of semiconductor material includes alternately placing wafers of semiconductor material and spacers in a jig to form a confined assembly of wafers having a spacer between each wafer and each wafer adjacent thereto, the area of contact of each spacer with the nickel plating on the major surface of a wafer being small relative to the area of the major surface;

and including the step of removing the spacers from the assembled plurality of wafers in the jig subsequent to the step of immersing the assembled plurality of wafers and spacers in molten solder material and prior to the step of pressing the wafers toward each other.

6. The method of producing semiconductor devices in accordance with claim 5 wherein each of said spacers is a generally V-shaped length of wire of generally circular cross section.

7. The method of producing semiconductor devices in accordance with claim 5 wherein each of said wafers has a region of semiconductor material of one conductivity type adjacent one major surface and a region of the opposite conductivity type adjacent the opposite major surface, said regions forming a PN junction therebetween parallel to the major surfaces; and said wafers are assembled with the region of the one conductivity type of each wafer adjacent the region of the opposite conductivity type of a wafer adjacent thereto.

8. The method of producing semiconductor devices in accordance with claim 7 wherein each of said spacers is a generally V-shaped length of nickel wire generally circular cross section;

the solder material is a lead-silver solder;

the step of cutting the assembly includes sawing intersecting sets of grooves through the assembly normal to the major surfaces of the wafers to form a plurality of separate elements each including a die of semiconductor material from each wafer of semiconductor material;

and including the step of treating the elements in etching material to remove conductive material and semiconductor material disturbed by sawing at the edges of the dice.